United States Patent [19]

Vermilyea

[11] Patent Number: 4,506,247
[45] Date of Patent: Mar. 19, 1985

[54] AXISYMMETRIC CORRECTION COIL SYSTEM FOR NMR MAGNETS

[75] Inventor: Mark E. Vermilyea, Schenectady, N.Y.

[73] Assignee: General Electric Company, Schenectady, N.Y.

[21] Appl. No.: 612,966

[22] Filed: May 23, 1984

[51] Int. Cl.³ .............................................. H01F 7/22
[52] U.S. Cl. .................................... 335/216; 335/299; 324/320
[58] Field of Search ................ 335/299, 216; 376/142, 376/146; 324/318, 319, 320, 322

[56] References Cited

U.S. PATENT DOCUMENTS

| | | | |
|---|---|---|---|
| 3,469,180 | 9/1969 | Anderson | 324/320 |
| 3,577,067 | 5/1971 | Weaver | 324/320 |
| 4,339,718 | 7/1982 | Bull | 324/319 |
| 4,456,881 | 6/1984 | Compton | 324/319 |

Primary Examiner—George Harris
Attorney, Agent, or Firm—Lawrence D. Cutter; James C. Davis; Marvin Snyder

[57] ABSTRACT

Even and odd pairs of axisymmetric correction coils are disposed on a cylindrical form at specified longitudinal positions. The coil pairs are intended to provide correction fields for high strength magnets employed in NMR imaging applications. The locations of the coils are chosen so that each coil pair generally contributes to all significant terms in the spherical harmonic expansion representation of the axial magnetic component in the volume within the central region of the cylindrical form except that certain coil pairs are selected and designed so as to fail to produce a particular one of these spherical harmonic component terms.

7 Claims, 3 Drawing Figures

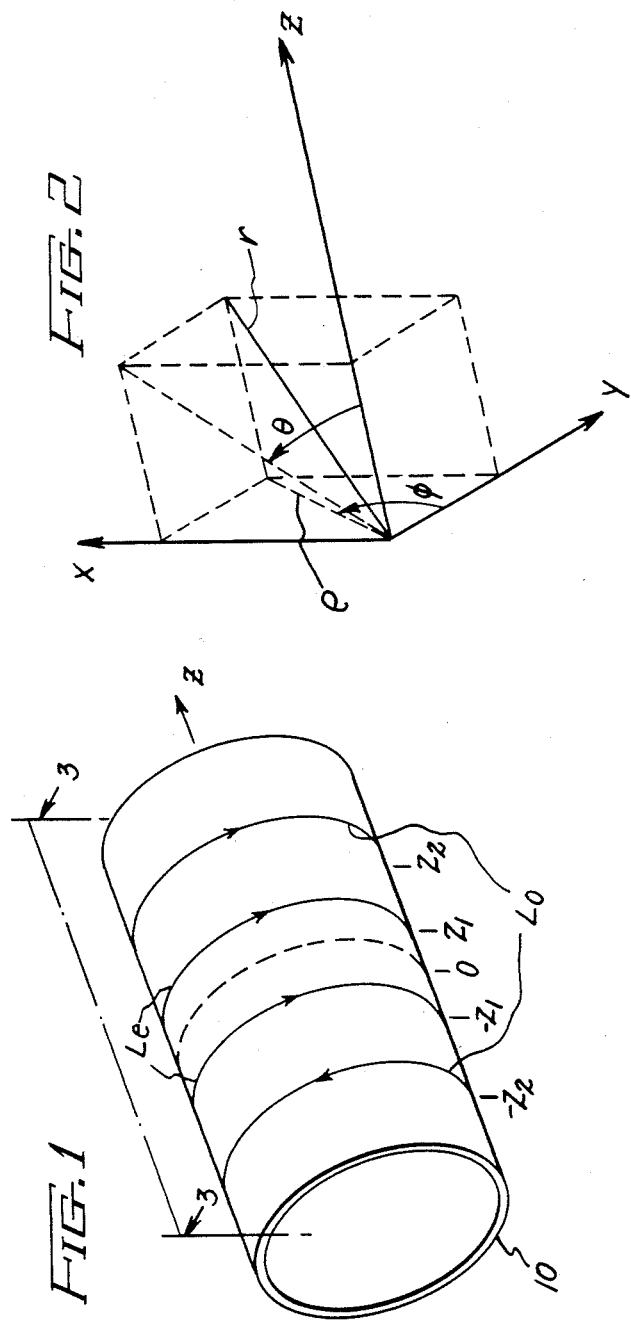
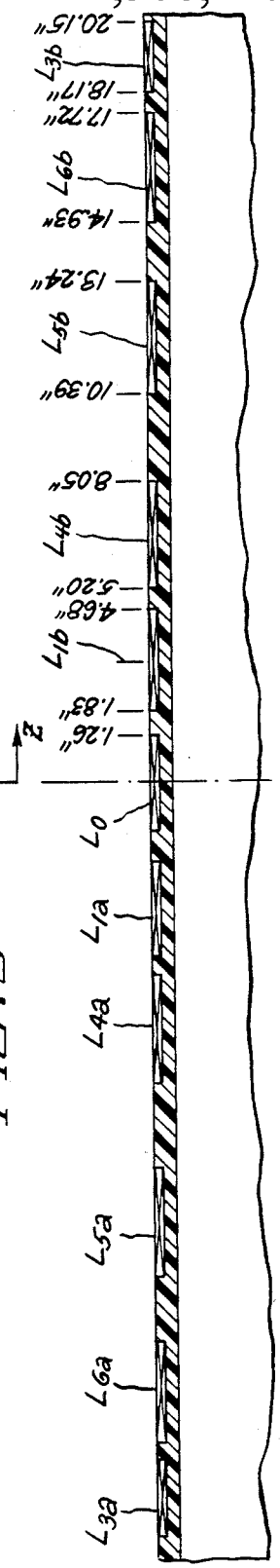
FIG. 1
FIG. 2
FIG. 3

AXISYMMETRIC CORRECTION COIL SYSTEM FOR NMR MAGNETS

BACKGROUND OF THE INVENTION

This invention relates to correction coils for use in shimming high strength magnets to produce a magnetic field with a highly uniform axial component. More particularly, the present invention relates to an axisymmetric correction coil set disposed on a cylindrical form for use in shimming main magnet coils used in NMR medical imaging diagnostic applications.

Nuclear magnetic resonance (NMR) phenomena, once limited to chemical analysis, are now being employed in the generation of tomographic and related medical diagnostic images of internal bodily organs. This technology offers several advantages over conventional x-ray technology. Firstly, NMR imaging techniques are totally non-invasive and do not generate ionizing radiation. Secondly, NMR imaging produces views of soft tissue structures that are not available with conventional x-rays. Thirdly, NMR imaging methodologies can be repeatedly employed over a period of time to observe metabolic, physiological and chemical changes occurring within the body of the patient. It is therefore seen that NMR imaging technology offers significant advantages in medical diagnostic applications.

However, one of the major requirements for NMR imaging is the presence of a highly uniform magnetic field. This uniform field may be provided by several different means. For example, a permanent magnet may be employed together with magnetic flux concentrating yokes, (or the like). Another method is to employ an electromagnet. A third method for producing a high strength uniform magnetic field is the utilization of superconducting coils disposed in a cryostat. Such superconducting coils have the advantage that, once established, the magnetic field persists for extended periods of time. Accordingly, its energy requirements are relatively small. The correction coil system of the present invention is nonetheless applicable to all of these systems; the permanent magnet, resistive electromagnet and especially the superconductive electromagnet systems.

In a permanent magnet system for supplying the desired uniform field, field uniformity is limited by the materials employed. Likewise, electromagnet designs are limited by manufacturing tolerances. For example, in a volume 20 centimeters by 20 centimeters by 20 centimeters, an error in placement of main superconductive coil windings of as little as 1 mil can mean a deviation in field homogeneity of as much as 100 parts per million. This departure from field homogeneity is generally not acceptable for medical diagnostic imaging purposes since it can produce images with undesirable artifacts.

Accordingly, the need for correction coils exists in all three conventional magnetic field generating techniques. Generally, these correction coils carry a current which is only a small fraction of the main winding current. Furthermore, as a consequence of their shimming purpose, the size and number of turns employed in correction coils is also small relative to the conductors in the main field coils. In general, correction coils produce field gradients in all directions in which the uncorrected field is likely to have gradients. Selective excitation of these coil sets is employed to increase the homogeneity of the field to the desired value.

The usual method of correction coil excitation begins with a measurement of the uncorrected field at many specified field locations. Conventional algorithms are then employed to match the correction coil gradients to those seen in the measured field and determines optimal current settings for all of the correction coils in the set. In general, the correction coil set that is required and its currents are dependent upon the design of the main coil and the homogeneity specifications. Increasing the number of main coils does in fact generally increase the inherent homogeneity of the magnetic field. However, this design method also increases the number of dimensions to which manufacturing and operating tolerances must be applied in order to determine correction coil needs. Furthermore, the presence of ferromagnetic materials in the operating environment of the magnet also requires field correction. To produce the desired axial gradients of the main field, axisymmetric coil sets are required. These coil sets may be even (that is symmetric about the midplane and exhibiting parallel current flow) or odd (that is symmetrically disposed but exhibiting antiparallel currents). Homogeneity specifications are often such that multiple even and odd correction coil sets must be used to provide sufficiently independently adjustable currents to meet them. Problems arise, however, since each even and odd correction coil set, unless properly designed, creates all field gradients allowed by its symmetry. The result of this duplication of gradients is higher currents in all correction coil sets since gradients produced may buck each other in setting the desired field. These bucking currents thus create a demand for higher coil currents or more turns of conductor, both of which are undesirable. It is therefore desirable to eliminate some gradients from each set, however, it is noted that elimination of all gradients but one is a formal impossibility. It is nonetheless advantageous for all coils to consist of one pair and be disposed on a single cylinder at the same radius, for manufacturing efficiency. Accordingly, it is desirable that the gradient elimination employed in the present invention should not require designs which eliminate this possibility. The goal is to minimize total ampere-turns necessary to shim a given field so that increasing the number of coils in a set to eliminate more harmonics is only practical if it reduces the required current accordingly.

SUMMARY OF THE INVENTION

In accordance with a preferred embodiment of the present invention, a correction coil system for improving homogeneity of the axial component of a magnetic field within a cylindrical volume comprises a cylindrical coil form together with a plurality of axisymmetric coil pairs disposed on the form at select positions along its longitudinal extent, these positions being selected so that at least one of said coil pairs functions so as not to contribute to a specific term of the spherical harmonic expansion representing the axial component of the magnetic field produced by the coil pair. In a preferred embodiment of the present invention the axisymmetric coil pair positions, each with its own associated coil width, are selected so that the coils present on the cylindrical form do not overlap. The correction coil windings may comprise either conventional resistive material or may in fact employ superconductive material. In particular, a correction coil system is illustrated in which there are present coil pairs disposed in such a fashion so that one coil pair exhibits no third term, another no fourth term, another no fifth term and yet another, no sixth term, in the above-mentioned spherical harmonic expansion.

Accordingly, it is an object of the present invention to provide a correction coil system for improving the homogeneity of the axial component of a magnetic field.

It is another object of the present invention to provide a correction coil system which is particularly useful for NMR imaging applications.

It is yet another object of the present invention to provide a correction coil system in which axisymmetric coils are placed on a single coil form in select locations without overlap.

It is also an object of the present invention to provide a system of axisymmetric correction coil sets capable of shimming an inhomogeneous field with the utilization of a minimal number of ampere turns of conductor.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1 is a schematic, isometric view of a cylindrical coil form together with two axisymmetric winding pairs illustrating the difference between odd and even coil winding pairs;

FIG. 2 is a schematic, isometric view of a coordinate system employed in coil location description and further illustrating the coordinate variables employed in spherical harmonic component expansions of the magnetic field component within a cylindrical volume;

FIG. 3 is a partial, cross-sectional view, such as is shown in FIG. 1, more particularly illustrating an embodiment of the present invention essentially employing six axisymmetric coil pairs disposed along the length of the cylinder as shown and also with the coil widths as shown.

DETAILED DESCRIPTION OF THE INVENTION

FIG. 1 is provided for the purpose of illustrating the difference between even and odd sets of coil pairs. FIG. 1 also illustrates the overall construction of the present invention which is provided in greater detail in FIG. 3. While it is indicated that FIG. 3 is actually a specific cross-section of FIG. 1, it should be borne in mind that the specific cross-section illustrated in FIG. 3 is not the exact cross-section that results from taking the cross-section as shown in FIG. 1. The cross-section shown in FIG. 1 is indicated only for the purpose of providing an indication of where the cross-section would be taken. However, FIG. 3 provides more detail than is appropriate for the purposes of FIG. 1. With respect to FIG. 1 and these purposes, it is noted that, on cylindrical coil form 10 there are wound two sets of coil pairs. All of the coils in each pair are described as axisymmetric coils since the coil winding structure is symmetric with respect to the central axis of coil form 10. Additionally, the coil windings are symmetrically disposed with respect to an imaginary midplane through the center of the cylinder perpendicular to its axis. This midplane intersects the cylinder in a circle which is shown dotted in FIG. 1. A coordinate system is selected so that its Z axis lies along the cylinder axis with the midplane being given by the equation $z=0$. Two sets of coil pairs are shown in FIG. 1 (in contrast to the several pairs shown in FIG. 3). In particular the coil pair designated as $L_e$ is an even coil pair since current is driven through each of the windings in the same direction around the cylindrical coil form, as indicated by the current flow arrows shown. More particularly it is seen that coil pair $L_e$ is positioned so that one of the coils in the pair lies in the plane $z=-z_1$ and the other half of the coil pair lies in the plane $z=+z_1$. It is the selection of these coil positions which forms a significant part of the present invention. Likewise, an odd coil pair, (designated by $L_o$) is disposed at the locations $z=-z_2$ and $z=+z_2$. The current flow arrows associated with coil pair $L_o$ indicate that the current in these two coils flow in opposite or antiparallel directions. It is the direction of current flow (and indirectly, winding direction) which determines whether a given axisymmetric coil pair is characterized as an even coil pair or an odd coil pair. While FIG. 1 provides a description of what is meant by an even coil pair and an odd coil pair, FIG. 1 can only be considered as a schematic diagram for illustrating coil pair placement. However, in actual coil design, the width of each coil winding must be taken into account. The width of each coil winding is essentially its extent in the z direction. Since electrical conductors themselves possess a finite diameter and since the ampere-turns requirements for these coils typically require a plurality of turns, each coil in each pair is therefore seen to necessarily exhibit a finite width. It is therefore seen that the placement of the axisymmetric coils on a cylindrical coil form requires considerations not only with respect to longitudinal coil placement but also consideration with respect to the width of each coil and its relationship with other adjacent coils to insure that overlap does not occur.

One of the major mathematical tools employed in design of NMR imaging magnet coils, correction coils and gradient coils is the expansion of the axial component of the magnetic field in terms of a spherical harmonic expansion. Such an expansion is given in the following equation in which the z component (that is the axial component) of the magnetic field, as a function of r and $\theta$ is given in terms of a set of coefficients $a_n$ and a set of Legendre polynomials $P_n$ with argument $\cos \theta$:

$$B_z(r,\theta) = \sum_{n=0}^{\infty} a_n r^n P_n(\cos \theta).$$

In the above r and $\theta$ represent the coordinates of the field point as shown in FIG. 2. It should be understood that the coordinate system of FIG. 2 is actually located at the center of the coil shown in FIG. 1. The z axis of FIG. 2 aligns with the z axis of FIG. 1 and the x-y plane of FIG. 2 corresponds to the midplane discussed above with respect to FIG. 1. The origin of the coordinate system is therefore located at the center of the cylindrical volume defined by coil form 10. The variable r is seen as being defined as the distance from the origin to a point lying on the cylinder. This point is seen as not necessarily lying in the x-y plane. The angle $\theta$ is a variable which is seen to be defined as the angle between the z axis and a line drawn from the origin to a point which is the perpendicular projection of the point r into the x-z plane. Also illustrated in FIG. 2 is variable $\rho$ which extends from the origin of the coordinate system to the cylinder in a perpendicular direction so as to represent the radius of the cylinder. Likewise, the variable $\phi$ is seen to be the angle measured between the positive direction of the y axis and a line extending from the origin perpendicular to the cylinder surface. In effect then, $\phi$ is a measure of circumferential position on the cylinder. Accordingly, it is seen then that positions on the surface of the cylinder may be equally well provided by either a specification of $\rho$ and z or by a specification of r and $\theta$.

The conventional method of coil excitation design begins with a measurement of the uncorrected axial component of the magnetic field at many known spatial coordinates. An algorithm is then employed to match the correction coil gradients to those seen in the field and to determine the optimal current settings for each correction coil set. The different correction coil sets required and their maximum field strengths are dependent on main coil design and homogeneity specifications. Increasing the number of main coils increases the homogeneity inherent in the main field but also increases the number of dimensions to which manufacturing and operating tolerances must be applied in order to determine correction coil needs. Additionally, the presence of ferromagnetic material in the magnetic operating environment also tends to require field correction. To produce the desired axial gradient corrections to the main field, axisymmetric coils as discussed above are employed. These coil sets may be even or odd. Homogeneity specifications are often so that multiple even and odd sets are employed to provide sufficiently independent adjustable currents to meet the requirements. A problem arises here since each even and odd set, unless properly designed, creates all field gradients allowed by its symmetry. The result of this duplication of gradients is higher currents in all correction coil sets since gradients produced may buck each other in establishing the corrected field. These bucking currents thus create a demand for higher coil currents or more turns of coil conductor, both of which are undesirable. It is therefore desirable to eliminate some gradients from each coil set. It is furthermore advantageous for all coils to consist of one pair and to be disposed on a single circular cylinder. In the correction coil design illustrated in FIG. 3 the goal of minimizing the total number of ampere turns necessary to shim the given field is realized.

To achieve the objects of the present invention spherical harmonic analysis of each coil set's field was employed. In the volume of interest each set's axial field is expressed as $B_z(r,\theta)$, as given above. Several attributes of this representation should be borne in mind. First, even terms in the expansion vanish for odd coil sets, and since they produce no common harmonics even and odd sets are decoupled. Correspondingly, odd terms in the expansion vanish for even coil sets and they also produce no common harmonics. Additionally, the dependence on the factor $r^n$ in each of the terms is noted for each harmonic. Therefore, higher order harmonics (that is for larger values of n) for which the coefficients $a_n$ are smaller, become more important at larger radii. For the radii of interest in NMR imaging, harmonics above n=16 are generally negligible, particularly relative to terms of the lowest order (n=0 or n=1). For $n \leq 10$, the harmonic coefficients are less than one percent of the coefficients of the lowest order terms. Accordingly, it is seen that in accordance with the present invention, regardless of the algorithm used to determine correction coil currents, the lower order harmonics will be weighted most heavily in the desired volume so that these harmonics are the ones which should be eliminated from some coil pairs.

A six-set coil design is described herein which incorporates this design criteria. However, while it is employed herein to illustrate the case for the six-set coil pair design, it should be appreciated that it is also applicable to other coil designs with different radii and different numbers of coil terms. Three odd and three even sets comprise the system. In FIG. 3 there are provided two odd sets of coil pairs which eliminate certain harmonics, namely coil pair $L_{5a}$ and $L_{5b}$ and coil pair $L_{3a}$ and $L_{3b}$. The coil set $L_{3a}$ and $L_{3b}$ is positioned in the axial direction so as to produce no third order harmonic. Likewise, the coil pair $L_{5a}$ and $L_{5b}$ is positioned so as to produce no fifth order harmonic. The zeroth and first order harmonics can only be eliminated by employing two coil pairs each in an even and odd set respectively. However, this is not an economic design choice. In a similar fashion, the two coil pairs, $L_{4a}$ and $L_{4b}$, and $L_{6a}$ and $L_{6b}$, produce no fourth order and no sixth order harmonics respectively. The second order harmonic has not been eliminated from any set in the design illustrated because of the limited choices for coil locations on the cylinder without overlay. The elimination of a harmonic term of order n requires the coil to be placed at a polar angle $\theta$ (See FIG. 2) at which the first derivative of the $(n+1)^{st}$ order Legendre polynominal (with argument at cos $\theta$), vanishes. At a given radius, this fixes the axial location of coil. The zeros of the derivatives of the Legendre polynomials, that is the zeros of $P_n$ are shown below in Table I along with the approximate axial locations for the center of a 50 centimeter radius coil to eliminate the $(n-1)^{st}$ harmonic:

TABLE I

| (n−1) | Zeroes of $P_n(\theta)$ (degrees) | Corresponding z at $\rho$ = 50 cm |
|---|---|---|
| 1 | — | — |
| 2 | 63.4 | 25.0 |
| 3 | 49.1 | 43.3 |
| 4 | 40.1 | 59.4 |
|   | 73.4 | 14.9 |
| 5 | 33.9 | 74.5 |
|   | 62.0 | 26.5 |
| 6 | 29.3 | 89.0 |
|   | 53.7 | 36.7 |
|   | 77.9 | 10.7 |
| 7 | 25.9 | 103.1 |
|   | 47.4 | 46.0 |
|   | 68.7 | 19.5 |

Some of these locations are impractically far from the center of the volume while others directly interfere with each other especially with coil widths taken into account. In this case, with the need the eliminate the fifth order harmonic, the only available option was the location at z=±26.5 centimeters, thus precluding the elimination of the second order harmonic without the use of two separate coil cylinders. However, the use of multiple coil forms is not generally desirable in this context. The design selected as optimal for the chosen circumstance (especially $\rho$=50 centimeters) is shown in FIG. 3. One each of the even and odd sets create all harmonics and were placed in physically convenient locations. Note the use of a single centered coil $L_0$ in the even set. Additionally, the symbol $L_o$, used in FIG. 1 to denote an odd coil pair, should not be confused with the symbol $L_0$ to denote the single centered coil in FIG. 3. The specific locations of the various coils and their widths are shown in FIG. 3 for a coil with a radius of 55.94 cm. The coil system is preferably mounted in grooves machined in a glass-epoxy composite. It is also noted that the coils in FIG. 3 exhibit a mirror image symmetry with respect to the dashed vertical centerline denoting the above-mentioned midplane. The coil locations are specified in inches. Additionally it is noted that FIG. 3 also includes a depiction of coordinate axis $\rho$ and z. However, these axes are located where shown only for convenience and for the purpose of indicating relative direction. As discussed above, they are more properly shown at the center of the cylindrical coil form. The widths of the coils will in general depend upon the size of the coefficients $a_n$ which are determined experimentally from field measurements. However, from a practical point of view it is preferable to select a representative set of coil widths and to adjust the currents therein accordingly.

The correction coil system of the present invention is particularly useful in shimming superconductive magnet coils. However, the system of the present invention is also applicable to magnet systems employing resistive coils or even to magnet systems employing permanent magnets. However, because of its high temporal stability, the coils of the present invention preferably comprise superconductive materials particularly when employed with a main magnet comprising a plurality of superconductive windings.

From the above it should therefore be appreciated that the correction coil system of the present invention provides a means for increasing magnetic field homogeneity with respect to the axial component of the magnetic field. It is also seen that the design of the present invention reduces the total number of ampere turns of conductor necessary to provide a specified degree of correction.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A correction coil system for improving the homogeneity of the axial component of a magnetic field within a cylindrical volume, said system comprising:
   a cylindrical form at least partially defining said volume;
   a plurality of axisymmetric coil pairs disposed on said form at selected positions along the longitudinal extent of said form, said positions being selected so that at least one of said axisymmetric coil pairs function so as not to contribute to the $n^{th}$ term of the spherical harmonic expansion representing the axial component of the magnetic field produced by said coil pair, where $n \neq 0$ and $n \neq 1$.

2. The coil of claim 1 in which said coil pairs comprise superconductive material.

3. The coil system of claim 1 in which at least one coil pair is an odd set.

4. The coil system of claim 1 in which at least one coil pair is an even set.

5. The coil system of claim 1 in which adjacently disposed coil windings do not overlap.

6. The correction coil system of claim 1 in which there are six of said axisymmetric coil pairs.

7. The correction coil system of claim 6 in which one of said axisymmetric coil pairs does not contribute to the third term of said expansion and in which another pair does not contribute to the fourth term of said expansion and in which yet another coil pair does not contribute to the fifth term of said expansion and yet a still further coil pair does not contribute to the sixth term of said expansion.

* * * * *